US012730158B2

(12) United States Patent
Sahoo et al.

(10) Patent No.: US 12,730,158 B2
(45) Date of Patent: Sep. 8, 2026

(54) METHOD FOR DETECTING A GROUND FAULT, A CONTROL UNIT AND AN ENERGY STORAGE SYSTEM

(71) Applicant: Hitachi Energy Ltd, Zürich (CH)

(72) Inventors: Mohapatra Bikash Kumar Sahoo, Bhadrak (IN); Kent Wikstrom, Västerås (SE); Ann Palesjo, Västerås (SE); Hongyang Zhang, Stockholm (SE); Saran Teja Malladi, Chennai (IN)

(73) Assignee: HITACHI ENERGY LTD, Zurich (CH)

( * ) Notice: Subject to any disclaimer, the term of this patent is extended or adjusted under 35 U.S.C. 154(b) by 60 days.

(21) Appl. No.: 19/270,041

(22) Filed: Jul. 15, 2025

(65) Prior Publication Data

US 2026/0023133 A1 Jan. 22, 2026

(30) Foreign Application Priority Data

Jul. 16, 2024 (EP) .................................... 24188981

(51) Int. Cl.
*G01R 31/52* (2020.01)
*G01R 19/02* (2006.01)
(Continued)

(52) U.S. Cl.
CPC ............. *G01R 31/52* (2020.01); *G01R 19/02* (2013.01); *G01R 31/385* (2019.01); *G01R 31/64* (2020.01)

(58) Field of Classification Search
CPC .......... G01R 31/52; G01R 31/382–388; G01R 31/64
See application file for complete search history.

(56) References Cited

U.S. PATENT DOCUMENTS 7,791,351 B2 * 9/2010 Raber .................... G01R 31/52 324/509
11,300,630 B2 4/2022 Eliassen
(Continued)

FOREIGN PATENT DOCUMENTS

EP 2508904 B1 3/2019
JP 6599802 B2 10/2019

OTHER PUBLICATIONS

Extended European Search Report issued in EP24188981.5, mailed Jan. 3, 2025, 6 pages.

*Primary Examiner* — Lee E Rodak
*Assistant Examiner* — Demetrius R Pretlow
(74) *Attorney, Agent, or Firm* — PROCOPIO, CORY, HARGREAVES & SAVITCH LLP

(57) ABSTRACT

There is disclosed herein a method for detecting a ground fault in an energy storage system comprising at least one string having a plurality of energy storage modules. The string is connected between a first direct current (DC) pole and a second DC pole. The first DC pole and the second DC pole are connected to an AC side through a respective converter. The method comprises determining a first co-phasal harmonic component based on at least one phase-to-ground voltage measured at the AC side, determining a second co-phasal harmonic component based on at least one pole-to-ground voltage measured at the DC side, and determining presence of a ground fault if the first co-phasal harmonic component increases and/or the second co-phasal harmonic component decreases. There is also disclosed herein a control unit and an energy storage system.

17 Claims, 3 Drawing Sheets

(51) Int. Cl.
*G01R 31/385* (2019.01)
*G01R 31/64* (2020.01)

(56) References Cited

U.S. PATENT DOCUMENTS

2016/0245853 A1 8/2016 Weiss et al.
2018/0241200 A1* 8/2018 Hu ......................... H02H 3/162
2020/0353834 A1 11/2020 Elshaer et al.

* cited by examiner

METHOD FOR DETECTING A GROUND FAULT, A CONTROL UNIT AND AN ENERGY STORAGE SYSTEM

CROSS-REFERENCE TO RELATED APPLICATIONS

The present application claims priority to European Patent Application No. 24188981.5, filed on Jul. 16, 2024, which is hereby incorporated herein by reference as if set forth in full.

TECHNICAL FIELD

The present disclosure relates to a method for detecting a ground fault in an energy storage system. The present disclosure further relates to a control unit for an energy storage system and an energy storage system.

BACKGROUND

The ongoing electrification of various sectors, such as transportation and heating, together with the demand for fossil-free energy sources, such as wind energy and solar energy, results in more complex power systems with a higher demand for energy. The fossil-free energy sources are often intermittent and to balance the supply and demand, energy storage systems are implemented in the power system at a larger scale. To meet such a high energy demand, a plurality of energy storage units is connected in series and parallel fashion to fulfill the voltage and current requirements.

Ground faults pose significant safety risks, including electrical shock hazards and fire hazards, and can also disrupt the efficient operation of energy storage systems. As such, detecting and addressing ground faults is crucial to ensure the reliability, safety, and performance of energy storage installations. A ground fault in or at a pole, or near to the pole location, can be detected based on the direct current pole voltage. However, a ground fault near to the electrical midpoint of the energy storage system will not affect the pole voltage and there will be almost no deviation in pole voltage from its normal operating condition, or a very small, deviation which might be not enough to detect the ground fault. Therefore, a refined method for detecting ground faults is required.

SUMMARY

It is therefore an object of the present disclosure to provide a method for detecting a ground fault in an energy storage system that alleviates at least part of the above-mentioned drawbacks. It is for example an object of the present disclosure to provide a method which reduces the risk that a ground fault is not detected and that is more efficient at detecting ground faults than existing methods. Further objects of the present disclosure are to provide a control unit which implements the method and an energy storage system comprising said control unit.

According to a first aspect of the present disclosure, a method for detecting a ground fault in an energy storage system is provided. The energy storage system comprises at least one string having a plurality of energy storage modules. The at least one string is connected between a first direct current, DC, pole and a second DC pole providing a DC side. The first DC pole is connected to an AC side through a first converter and the second DC pole is connected to the AC side through a second converter. The method comprises determining a first co-phasal harmonic component based on at least one phase-to-ground voltage measured at the AC side, determining a second co-phasal harmonic component based on at least one pole-to-ground voltage measured at the DC side, and determining presence of a ground fault if the first co-phasal harmonic component increases and/or the second co-phasal harmonic component decreases.

According to a second aspect of the present disclosure, a control unit for an energy storage system is provided. The energy storage system comprises at least one string having a plurality of energy storage modules. The at least one string is connected between a first direct current, DC, pole and a second DC pole providing a DC side. The first DC pole is connected to an AC side through a first converter and the second DC pole is connected to the AC side through a second converter. The control unit is configured to determine a first co-phasal harmonic component based on at least one phase-to-ground voltage measured at the AC side, determine a second co-phasal harmonic component based on at least one pole-to-ground voltage measured at the DC side, and determine presence of a ground fault if the first co-phasal harmonic component increases and the second co-phasal harmonic component decreases.

According to a third aspect of the present disclosure, an energy storage system is provided. The energy storage system comprises at least one string having a plurality of energy storage modules. The at least one string is connected between a first direct current, DC, pole and a second DC pole providing a DC side. The first DC pole is connected to an AC side through a first converter and the second DC pole is connected to the AC side through a second converter. The energy storage system further comprises a control unit according to the second aspect.

Ground faults are a common problem in electrical systems and may on some occasions be challenging to detect and to locate, which increases the number of maintenance hours to solve the ground fault. Especially, ground faults near an electrical midpoint of a string are challenging to detect with the conventional methods for detecting ground faults.

The electrical midpoint may be seen as a neutral point, where the potential with respect to ground or a common reference is zero. This point may exist inside one of the energy storage modules (located at mid-location between the two poles) or between two energy storage modules that are at approximately the same electrical distance from each of the first and second DC poles.

With the provided method, ground faults near one of the first and second DC poles and also ground faults at or close to the electrical midpoint can be detected. By determining the first co-phasal harmonic component and the second co-phasal harmonic component and determining if a change occurs in the first co-phasal harmonic component or the second co-phasal harmonic component, a ground fault can be detected. It can be determined that a ground fault is present in the energy storage system by monitoring if the first co-phasal harmonic component increases or if the second co-phasal harmonic component decreases. The first co-phasal harmonic component and the second co-phasal harmonic component are not dependent on where the ground fault occurs in the string. The increase/decrease will be observed even if the ground fault is at the electrical midpoint. The provided method is therefore more efficient than conventional methods as ground faults can be detected everywhere in the energy storage system. This reduces the risk of a ground fault not being discovered and this therefore also increases the safety of the energy storage system.

A ground fault can be detected based on only one of the first co-phasal harmonic component and the second co-phasal harmonic component, however, it may be advantageous using both as this will provide a back-up parameter for determining if a ground fault is present or not. With both the first co-phasal harmonic component and the second co-phasal harmonic component, a more accurate identification of the ground fault may be achieved. The first co-phasal harmonic component is based on the at least one measured phase-to-ground voltage. The method generally uses all phases of the AC side to determine the first co-phasal harmonic component. However, only one phase may be used with sufficient result. If a ground fault occurs in the energy storage system, it is expected that the first co-phasal harmonic component, determined on the AC side, increases. A ground fault at the DC side may also be detected based on whether a DC component, i.e., a DC offset, appears in the measured phase-to-ground voltage at the AC side. The second co-phasal harmonic component is based on the at least one pole-to-ground voltage measured at the DC side 2. Generally, both the pole-to-ground voltage of the first DC pole and the pole-to-ground voltage of the second DC pole are measured and used for determining the second co-phasal harmonic component. If a ground fault occurs in the energy storage system, it is expected that the second co-phasal harmonic component, determined on the DC side, decreases.

The co-phasal harmonic component refers to a triple-n harmonic (where n is 1, 2, 3, etc.) of the fundamental frequency and it has the same fundamental waveform as the fundamental frequency. As an example, if the fundamental frequency is 50 Hz and the third harmonic is 150 Hz in a 3-phase system, then the 150 Hz component will be generated in all three phases and they will be aligned in phase with each other (i.e., because of co-phasal components). It should be noted that sub-multiples may also be used. Co-phasal harmonic components are additional layers superimposed on the fundamental voltage, which might be used to reduce the voltage peaks. Hence, it might help to reduce the size of the converter. Because these harmonic components occur at different frequencies (co-phasal in nature), they are relatively easy to track in the presence and absence of ground fault.

Generally, the energy storage system comprises a plurality of strings that is connected between the first DC pole and the second DC pole. In each string there is a plurality of energy storage modules. The plurality of energy storage modules may be arranged in series and/or parallel to each other, depending on the system requirements. The energy storage modules may be super capacitor, or batteries, serially connected and/or connected in parallel. Further, each energy storage module may comprise a plurality of energy storage cells arranged in parallel and/or in series.

The first DC pole and the second DC pole may also be a positive pole and a negative pole of the DC side, respectively.

Each of the first and second DC poles is connected to the AC side through a respective converter, i.e., the first converter and the second converter. The first converter and the second converter may each be of wye configuration. The first converter and the second converter may be a first modular multilevel converter, MMC, and a second MMC.

The AC side is herein meant as the side of the first converter and the second converter that is or can be connected to a power grid.

The method may further comprise determining a pole unbalance voltage based on voltages measured at the first and second DC poles for determining if the ground fault is located at an electrical mid-point of the string or close to a DC pole.

By also determining the pole unbalance voltage, the location of the ground fault can be determined. As an example, if the first DC pole is a positive DC pole and the second DC pole is a negative DC pole, a positive pole unbalance voltage would indicate that the ground fault is located closer to the second DC pole, while a negative pole unbalance voltage would indicate that the ground fault is located closer to the first DC pole. Based on the magnitude and the polarity of the pole unbalance voltage, an approximate location of the ground fault in a string can be determined. However, if the fault is in the electrical mid-point, there will be no or only a small pole unbalance voltage. Therefore, only the pole unbalance voltage would not be able to detect and locate a ground fault at the electrical mid-point. By combining the use of a deviation in the first co-phasal harmonic component and/or the second co-phasal harmonic component to detect a ground fault and the use of a pole unbalance voltage to locate the ground fault, the method may determine if the ground fault is at, or close to, the electrical mid-point. If the first co-phasal harmonic component and/or the second co-phasal harmonic component indicates that there is a ground fault in the energy storage system and there is no, or only a small (negligible), pole unbalance voltage, the method can determine that the ground fault is located at or close to the electrical mid-point.

The pole unbalance voltage refers to a voltage unbalance between the first and second DC poles of the energy storage system. In a balanced energy storage system, the absolute values of the voltages at the first and second DC poles are the same. This means that if the voltage at each pole is measured relative to a common reference point, such as ground, the voltages would have equal magnitudes but opposite polarities. In this case, the pole unbalance voltage would be zero. However, if an unbalance occurs between the first and second DC poles, the absolute values of the voltages would not be the same, and the pole unbalance voltage would not be zero.

A ground fault may be determined if the first co-phasal harmonic component increases and/or the second co-phasal harmonic component decreases for a predetermined operating time.

When measuring currents and voltages, there is a risk that spikes or sudden rises in the measurements may occur. Spikes refers to a sudden, brief increase in voltage or current that may occur due to, for example, lightning, switching operation and electromagnetic interference. By only determining a ground fault as detected if the first co-phasal harmonic component increases and/or the second co-phasal harmonic component decreases for the predetermined operating time, it may be avoided that the method falsely indicates that there is a ground fault in the energy storage system due to a spike. By using a predetermined operating time for the determination, the accuracy may be further increase, i.e., the risk of a false detection may be reduced. The predetermined operating time may be set to greater than or equal to a fundamental cycle of the AC voltage.

The method may further comprise generating a first predetermined co-phasal harmonic voltage with the first and second converters and/or a second predetermined co-phasal harmonic voltage with the first and second converters and comparing the first predetermined co-phasal harmonic voltage with the determined first co-phasal harmonic component, and/or the second predetermined co-phasal harmonic voltage with the determined second co-phasal harmonic component.

The first and second converters may be used to generate the first predetermined co-phasal harmonic voltage at the AC side and the second predetermined co-phasal harmonic voltage at the DC side. This generated first predetermined co-phasal harmonic voltage and second predetermined co-phasal harmonic voltage can be used as references for comparison with the determined first co-phasal harmonic component and the determined second co-phasal harmonic component. In other words, the first and second converters are provided with an input to generate the first predetermined co-phasal harmonic voltage and the second predetermined co-phasal harmonic voltage. Each of the first and second converters generates fundamental voltage and DC voltage to exchange active power and reactive power between the AC side and the DC side. Together with the fundamental voltage and the DC voltage, the first and second converters may be controlled to generate the first predetermined co-phasal harmonic voltage and the second predetermined co-phasal harmonic voltage. The generated first predetermined co-phasal voltage and second predetermined co-phasal harmonic voltage propagate with fundamental and DC voltage. They may then be determined, i.e. extracted, at later stages at the AC side and the DC side from the fundamental voltage and the DC voltage as the first co-phasal harmonic component and the second co-phasal harmonic component. By comparing the first predetermined co-phasal harmonic voltage with the determined first co-phasal harmonic component, and/or the second predetermined co-phasal harmonic voltage with the determined second co-phasal harmonic component, a further way for determining presence of a ground fault is provided. During normal operation, it is expected that the first predetermined co-phasal harmonic voltage and the first co-phasal harmonic component are equal, and that the second predetermined co-phasal harmonic voltage and the second co-phasal harmonic component are equal. If the predetermined co-phasal harmonic voltage and the co-phasal harmonic component are not equal (or at least differ from each other by at least a predetermined threshold), it is an indication of a ground fault at the AC side or the DC side as the ground fault causes a change in the distribution of the generated co-phasal harmonic voltage and hence the determined co-phasal harmonic component. A predetermined value or predetermined voltage is in this context a value (or voltage) of a desired form of the co-phasal harmonic voltage, as e.g. set by an operator. The predetermined co-phasal harmonic voltage may have a low magnitude to reduce interaction during normal operation of the converter.

The method may further comprise comparing said first co-phasal harmonic component and said second co-phasal component. A ground fault may be detected by comparing the first co-phasal harmonic component with the second co-phasal harmonic component to detect a change in the relation between these. As an example, the method may be designed such that the first co-phasal harmonic component and the second co-phasal harmonic component are expected to be of the same value when determined. In this design a ground fault is detected when the relation (e.g., the ratio of the difference) between the first co-phasal harmonic component and the second co-phasal harmonic component changes. This allows the operator to implement a further parameter for detecting if a ground fault is present.

The method may further comprise obtaining a control signal based on the first co-phasal harmonic component and the second co-phasal harmonic component. The comparison may include comparing said control signal with a threshold value. The first co-phasal harmonic component and the second co-phasal harmonic component may be used to obtain the control signal. The control signal is a value that during normal operation is constant. The control signal can then be compared with the threshold value to detect if a ground fault is present. The possibility to use a threshold value allows the operator to set the threshold value with a margin of safety such that falsely indicated ground faults are avoided.

The control signal may be obtained from a first root mean square, RMS, value of the first co-phasal harmonic component and a second RMS value of the second co-phasal harmonic component.

RMS values are advantageous in electrical control systems as they provide a more reliable and more accurate determination of the effective value of an alternating quantity. The RMS values facilitate the analysis of the signals.

The control signal may be obtained by subtracting the second co-phasal harmonic component from the first co-phasal harmonic component. If the method is designed such that the first co-phasal harmonic component and the second co-phasal harmonic component are equal during normal operation, this would result in that the control signal is zero during normal operation. When the control signal deviates from zero, presence of a ground fault may be detected.

The first co-phasal component may be determined from a residual voltage of the AC side. The residual voltage may be calculated as a sum of all phase-to-ground voltages at the AC side.

The first co-phasal harmonic component may be multiplied with a factor 1/k before obtaining the control signal. The factor 1/k may be used to scale the first co-phasal harmonic component such that the first co-phasal harmonic component can easily be compared with the second co-phasal harmonic component.

The parameter k may be a ratio of a DC side grounding capacitance and an AC side (RC circuit) filter capacitance.

The second co-phasal harmonic component may be determined as a sum of a pole to ground voltage measured at the first DC pole and a pole to ground voltage measured at the second DC pole.

The method may further comprise tripping the energy storage system if a ground fault is detected. When a ground fault is detected, it may be advantageous to trip the energy storage system such that the energy storage system is disconnected from the AC side. This stops the ground fault from affecting other components at for example the AC side.

The energy storage system may further comprise a voltage measurement device for each phase at the converter AC side to measure a respective phase to ground voltage and for each of the first DC pole and the second DC pole to measure a respective pole to ground voltage.

The AC side and the DC side may be ungrounded or high impedance grounded. Generally, energy storage systems connected to the AC side through the first and second converters are preferred to be ungrounded or high impedance grounded systems as it provides the advantage that if a ground fault occurs on the DC side, this will only lead to a low fault current compared to a grounded system. The method is especially advantageous in ungrounded and high impedance grounded systems, as ground faults at the electrical mid-point is challenging to detect in such systems.

As an example, high impedance grounding may be achieved with the energy storage system comprising a first capacitor grounding for the first DC pole and a second capacitor grounding for the second DC pole, and a resistor-capacitor, RC, filter for each phase at the AC side. The value of the capacitances of the first and second capacitors and of the RC filter should preferably provide high impedance to ground at low frequencies.

Effects and features of the second aspect and the third aspect may be largely analogous to those described above in connection with the first aspect. Embodiments mentioned in relation to the first aspect may be at least largely compatible with the second aspect and the third aspect. It is further noted that the present disclosure relates to all possible combinations of features unless explicitly stated otherwise.

A further scope of applicability of the present disclosure will become apparent from the detailed description given below. However, it should be understood that the detailed description and specific examples, while indicating preferred embodiments of the disclosure, are given by way of illustration only, since various changes and modifications within the scope of the disclosure will become apparent to those skilled in the art from this detailed description.

Hence, it is to be understood that the present disclosure is not limited to the particular parts of the method, control unit and energy storage system described herein. It is also to be understood that the terminology used herein is for the purpose of describing particular embodiments only, and it is not intended to be limiting.

BRIEF DESCRIPTION OF THE DRAWINGS

The above and other aspects of the present disclosure will now be described in more detail, with reference to the appended figures, wherein.

DETAILED DESCRIPTION

The present disclosure is described in the following by way of a number of illustrative examples. It will be appreciated that these examples are provided for illustration and explanation only and are not intended to be limiting on the scope of the disclosure.

Figure 1:
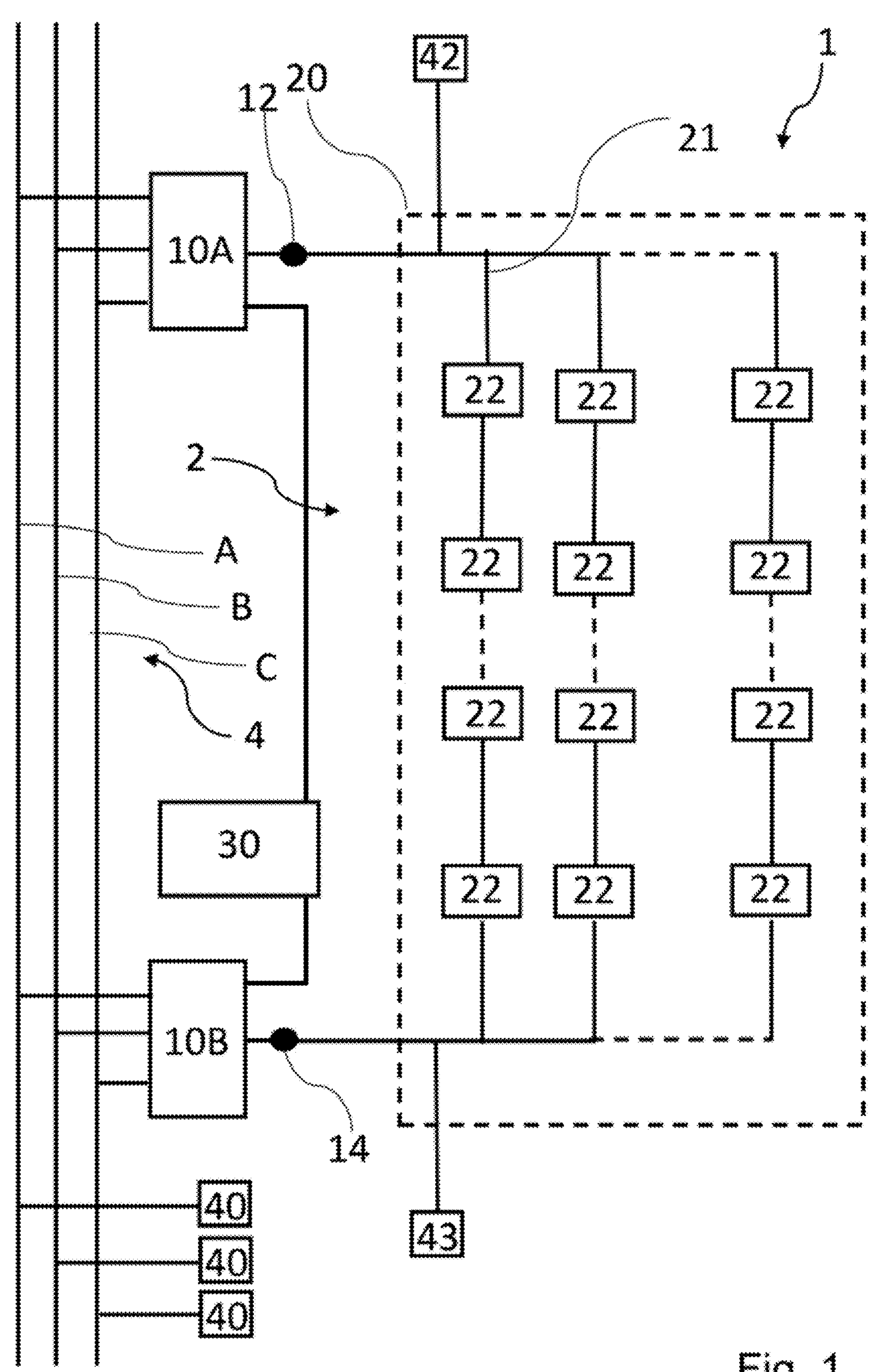
FIG. 1 schematically shows an energy storage system comprising a control unit.

FIG. 1 discloses an exemplifying embodiment of a system 1 comprising a first converter 10A, a second converter 10B, an energy storage system 20 and a control unit 30. Each of the first converter 10A and the second converter 10B comprises an AC side 4 (which may be a connection to, e.g., an AC grid) and a DC-side 2. The first converter is connected to a first DC pole 12 of the DC side 2 and the second converter is connected to a second DC pole 14 of the DC side 2. The energy storage system 20 is connected between the first DC pole 12 and the second DC pole 14. The AC side 4 is provided with three phases A, B, C, each being connected to the first converter 10A and the second converter 10B.

The energy storage system 20 comprises a plurality of strings 21 each having a plurality of serially connected energy storage modules 22. Each string 21 is connected between the first DC pole 12 and the second DC pole 14. The energy storage modules 22 may be connected both in series and parallel, depending on the system requirements. In FIG. 1 the energy storage modules 22 are only arranged in series. Further, each energy storage modules may comprise a plurality of energy storage cells (not shown) that can be arranged in parallel and/or in series to each other.

The energy storage system 20 further comprises a first capacitor grounding 42 for the first DC pole 12 and a second capacitor grounding 43 for the second DC pole 14. A resistor-capacitor, RC, filter 40 for each phase is provided at the AC side 4. In this case, the AC side 4 and the DC side 2 are high impedance grounded providing a high impedance grounded system. However, it is also common with ungrounded systems. Generally, energy storage systems 20 are preferred to be ungrounded or high impedance grounded as this provides the advantage that, if a single ground fault occurs on the DC side 2, this will only lead to a low fault current compared to a grounded system. The method 100, that will be further discussed in connection to FIGS. 2 and 3, is especially advantageous for ungrounded and high impedance grounded system, as ground faults at the electrical midpoint are challenging to detect in ungrounded and high impedance systems.

The energy storage system 20 may further comprise a voltage measurement device (not shown) for each phase at the AC side 4 and for each of the first DC pole 12 and the second DC pole 14. The phase-to-ground voltage and the pole-to-ground voltage may be measured with the voltage measurement devices. The voltage measurement devices are capable of measuring both AC and DC voltages.

The control unit 30 is provided to control the first converter 10A and the second converter 10B and to operate in accordance with the method 100 that will be further described in connection to FIGS. 2 and 3.

Figure 2:
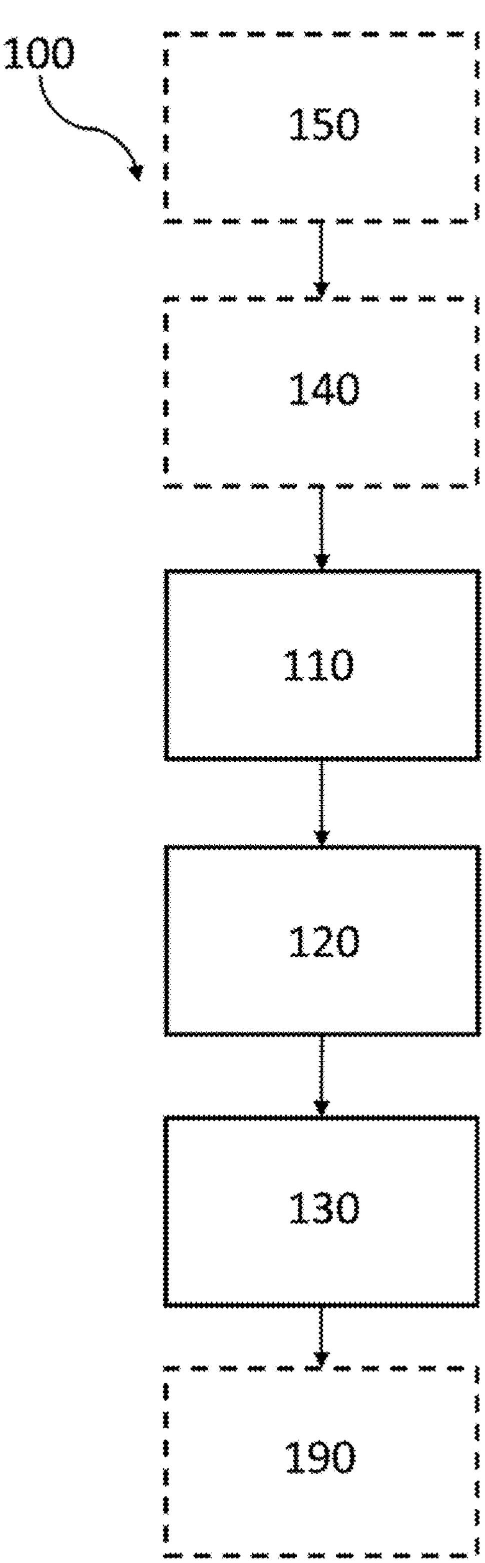
FIG. 2 schematically shows a method for detecting a ground fault.
Figure 3:
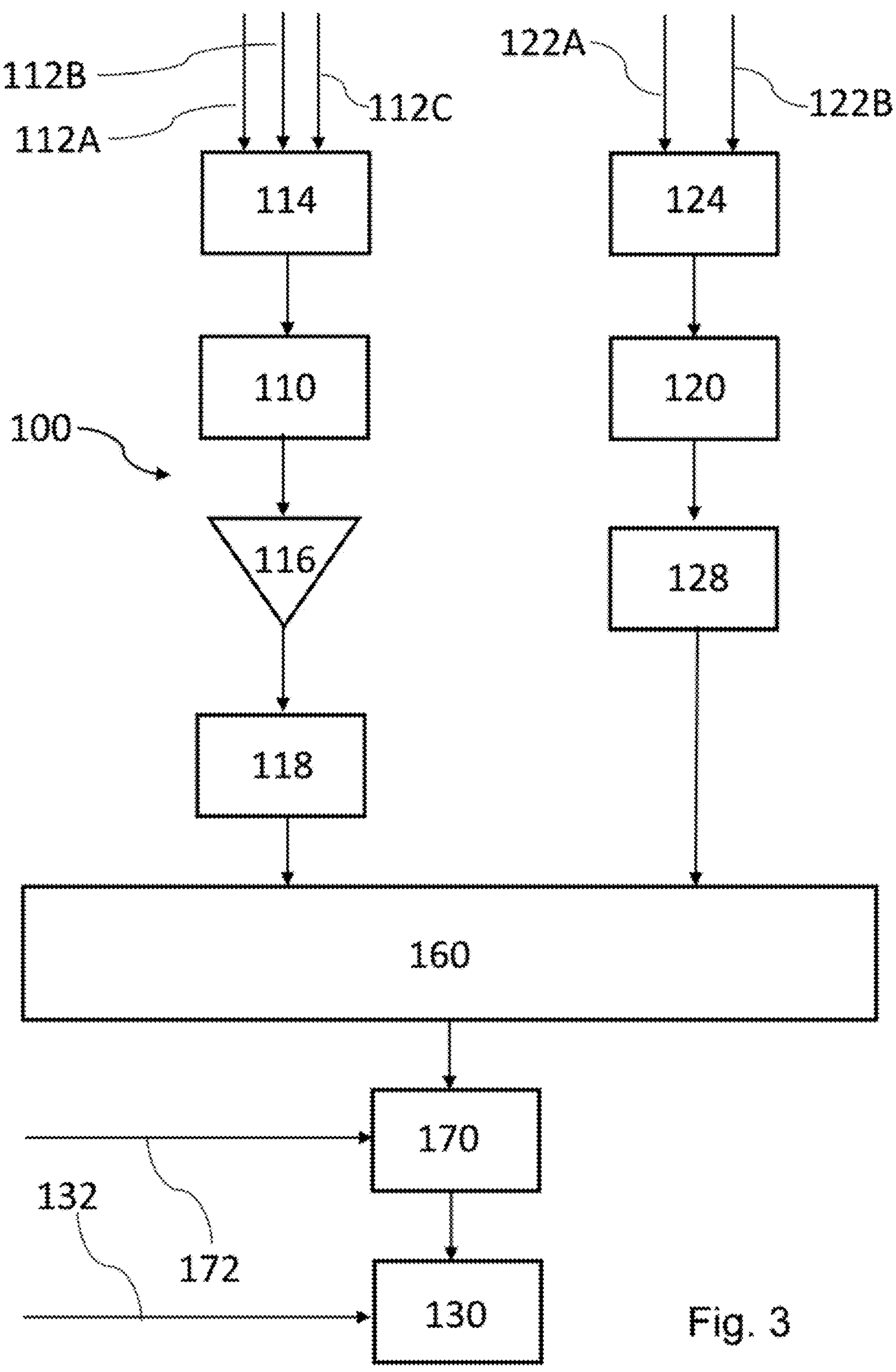
FIG. 3 schematically shows a flow scheme of the method.

In FIG. 2, an overview of the method 100 is illustrated. In FIG. 3, a flow scheme illustrates how the method 100 could be implemented.

FIG. 2 provides a method 100 with three steps for detecting a ground fault in an energy storage system 20 as described in connection to FIG. 1. The method 100 comprises determining 110 a first co-phasal harmonic component based on at least one phase-to-ground voltage 112A-112C measured at the AC side 4. This provides a measurement on the AC side 4 where it can be monitored whether the first co-phasal harmonic component changes. The method 100 further comprises determining 120 a second co-phasal harmonic component based on at least one pole-to-ground voltage 122A, 122B measured at the DC side 2. This provides a measurement on the DC side 2 where it can be monitored whether the second co-phasal harmonic component changes. To determine if a ground fault is present, the method 100 further comprises determining 130 presence of a ground fault if the first co-phasal harmonic component increases and/or the second co-phasal harmonic component decreases. By monitoring at least one of the first co-phasal harmonic component and the second co-phasal harmonic component, presence of a ground fault in the energy storage system 20 can be determined. It is expected that the first co-phasal harmonic component at the AC side 4 will experience an increase if a ground fault is present at the energy storage system 20. Further, it is expected that the second co-phasal harmonic component at DC side 2 will experience a decrease if a ground fault is present at the energy storage system 20. Observation of only one of the first co-phasal harmonic component and the second co-phasal harmonic component is sufficient to detect presence of a ground fault in the energy storage system 20. However, by using both of the first co-phasal harmonic component and the second co-phasal harmonic component a more accurate way of determining presence of a ground fault is provided. It is expected that if the first co-phasal harmonic component increases, the second co-phasal harmonic component should decrease. If this is not the case, further troubleshooting may be necessary.

This method 100 of detecting a ground fault in the energy storage system 20 is especially advantageous for ground faults near an electrical midpoint of the string 21 as these ground faults are challenging to detect with the conventional methods for detecting ground faults. The electrical midpoint may be seen as a neutral point, where the potential with respect to ground or a common reference is zero. This point may exist inside one of the energy storage modules 22 or between two energy storage modules 22 that are at approximately the same electrical distance from each of the first DC pole 12 and the second DC pole 14. With the provided method 100 ground faults near one of the first DC pole 12 and the second DC pole 14 and also ground faults at or close to the electrical midpoint can be detected.

The first co-phasal harmonic component is based on the at least one measured phase-to-ground voltage 112A-112C. The method 100 generally measures the phase-to-ground voltage 112A-112C of all phases A-C of the AC side 4 to determine the first co-phasal harmonic component.

The second co-phasal harmonic component is based on the at least one pole-to-ground voltage 122A, 122B, which is measured at the DC side 2. Generally, both the pole-to-ground voltage 122A, of the first DC pole 12 and the pole-to-ground voltage 122B of the second DC pole 14 are measured and used for determining the second co-phasal harmonic component.

Further, a ground fault may also be detected at the AC side 4 based on whether a DC component appears in the measured phase-to-ground voltages 112A-112C.

The method 100 may detect a ground fault based on whether the first co-phasal harmonic component increases and/or the second co-phasal harmonic component decreases for a predetermined operating time 132. When measuring voltages, sudden rises in the measurements may occur, these sudden rises may be referred to as spikes. Spikes are brief increase in voltage or current that may occur due to for example lightning, switching operation and electromagnetic interference. When the method 100 directly indicates that a ground fault is present based on the first co-phasal harmonic component having increased and/or the second co-phasal harmonic component having decreased, there may be occasions in which it was a spike that triggered a false alarm. By determining presence of a ground fault based on the first co-phasal harmonic component having increased and/or the second co-phasal harmonic component having decreased for the predetermined operating time 132, false detection such as caused by spikes, may be avoided, or at least reduced.

The previously described steps allow the method 100 to detect a ground fault in the energy storage system 20. To allow the method 100 to also locate the ground fault, the method 100 may further comprise determining 140 a pole unbalance voltage based on pole-to-ground voltages measured at the first DC pole 12 and the second DC pole 14 for determining if the ground fault is located at an electrical midpoint of the string 21 or close to one of the first and second DC poles 12, 14. As an example, if the first DC pole 12 is a positive DC pole and the second DC pole 14 is a negative DC pole, a positive pole unbalance voltage indicates that the ground fault is located closer to the second DC pole 14, while a negative pole unbalance voltage indicates that the ground fault is located closer to the first DC pole 12. Based on the magnitude and the polarity of the pole unbalance voltage, an approximate location of the ground fault in a string 21 can be determined. However, if the fault is at the electrical midpoint, there will be no, or only a small, pole unbalance voltage. Therefore, considering only the pole unbalance voltage would not be sufficient to detect and locate a ground fault at the electrical mid-point. With both the first co-phasal harmonic component and the second co-phasal harmonic component being used for detection of a ground fault and the pole unbalance voltage being used for locating the ground fault, presence of the ground fault at the electrical mid-point may be determined. The first co-phasal harmonic component and/or the second co-phasal harmonic component will indicate e if there is a ground fault. If the first co-phasal harmonic component and/or the second co-phasal harmonic component indicates that there is a ground fault in the energy storage system and there is no, or only a small, pole unbalance voltage, the method 100 can determine that the ground fault is located in or close to the electrical mid-point.

The first and second converters 10A, 10B may be used to generate 150 a first predetermined co-phasal harmonic voltage at the AC side 4 and a second predetermined co-phasal harmonic voltage at the DC side 2. This generated first predetermined co-phasal harmonic voltage and second predetermined co-phasal harmonic voltage can be used as references for comparing with the (at a later stage) determined first co-phasal harmonic component and the (at the same later stage) determined second co-phasal harmonic component. In other words, the method 100 may further comprise generating 150 a first predetermined co-phasal harmonic voltage with the first and second converters and/or a second predetermined co-phasal harmonic voltage with the first and second converters. The method 100 may further comprise comparing the first predetermined co-phasal harmonic voltage with the determined first co-phasal harmonic component, and/or the second predetermined co-phasal harmonic voltage with the determined second co-phasal harmonic component.

The first and second converters 10A, 10B generate fundamental voltage and DC voltage to exchange active power and reactive power between the AC grid and the energy storage system 1. Together with the fundamental voltage and DC voltage, the first and second converters 10A, 10B are controlled to generate 150 the first predetermined co-phasal harmonic voltage and the second predetermined co-phasal harmonic voltage. The generated first predetermined co-phasal voltage and second predetermined co-phasal harmonic voltage propagate with fundamental and DC voltage. They may then be determined, i.e. extracted, at later stages at the AC side 4 and the DC side 2 from the converter generated voltages, as the first co-phasal harmonic component and the second co-phasal harmonic component. By comparing the first predetermined co-phasal harmonic voltage with the determined first co-phasal harmonic component, and/or the second predetermined co-phasal harmonic voltage with the determined second co-phasal harmonic component, a further way for determining presence of a ground fault is provided. During normal operation, it is expected that the first predetermined co-phasal harmonic voltage and the first co-phasal harmonic component are equal, and that the second predetermined co-phasal harmonic voltage and the second co-phasal harmonic component are equal. If the predetermined co-phasal harmonic voltage and the co-phasal harmonic component are not equal (or at least differ from each other by at least a predetermined threshold), it is an indication of a ground fault at the AC side or the DC side as the ground fault causes a change in the distribution of the generated co-phasal harmonic voltage and hence the determined co-phasal harmonic component. The co-phasal harmonic voltage is a voltage generated by the first and second converters 10A, 10B. The co-phasal harmonic component refers to a triple-n harmonic (where n is 1, 2, 3, etc.) of the fundamental frequency and it has the same fundamental waveform as the fundamental frequency. As an example, if the fundamental frequency is 50 Hz and the third harmonic is 150 Hz in a 3-phase system, then the 150 Hz component will be generated in all three phases and they will be aligned in phase with each other (i.e., because of co-phasal components).

The co-phasal harmonic voltage is generated with a low magnitude for keeping the active power and the reactive power at a minimum.

When a ground fault is detected, it may be advantageous to trip/disconnect the energy storage system 20 such that the energy storage system 20 is disconnected from the AC side 4. In other words, the method 100 may further comprise tripping 190 the energy storage system 20 if a ground fault is detected.

As can be understood from FIG. 2, the dotted boxes represent optional steps that may be implemented in the method 100 to provide further functionalities.

In FIG. 3 a detailed example of how the method 100 may operate is provided. Starting from the top of the figure, measurements of the phase-to-ground voltage 112A-112C, one for each phase A-C of the AC side 2 are provided. The phase-to-ground voltages 112A-112C are used to determine a residual voltage 114 of the AC side. The residual voltage 114 may be calculated as a sum of all phase-to-ground voltages 112A-112C at the AC side 4. The residual voltage 114 of the phase-to-ground voltages 112A-112C (i.e., the sum of all three phase to ground voltage) may thereafter be used for determining 110 the first co-phasal harmonic component.

The second co-phasal harmonic component may be determined 120 as a sum 124 of a pole-to-ground voltage 122A measured at the first DC pole 12 and a pole-to-ground voltage 122B measured at the second DC pole 14.

The method 100 in FIG. 3 further comprises comparing said first co-phasal harmonic component and said second co-phasal harmonic component. This comparison may be used to obtain 160 a control signal. In one embodiment this comparison means that the control signal may be obtained by subtracting the second co-phasal harmonic component from the first co-phasal harmonic component.

To improve the control signal, the first co-phasal harmonic component may be subjected to a factor 1/k 116 before obtaining the control signal. The factor 1/k 116 may be used to scale the first co-phasal harmonic component such that the first co-phasal harmonic component can easily be compared with the second co-phasal harmonic component. The factor 1/k 116 may be a DC side grounding capacitance 42, 43 divided with an AC side filter capacitance 40. The control signal may be obtained from a first root mean square, RMS, value 118 of the first co-phasal harmonic component and a second RMS value 128 of the second co-phasal harmonic component.

With the design described in FIG. 3, the first co-phasal harmonic component and the second co-phasal harmonic component are expected to be of the same value when compared, thereby resulting in a control signal, which is zero, or close to, during normal operation. In this design, a ground fault is detected when the relation between the first co-phasal harmonic component and the second co-phasal harmonic component is changed. This allows the operator to study the changes of the control signal to detect a ground fault. The control signal can be compared with a threshold value 132 to detect if a ground fault is present. The possibility to use a threshold value 132 allows the operator to set the threshold value with a safety margin such that false alarms are avoided. Further, the threshold value 132 can also be linked to the generated co-phasal harmonic components by the converters 10A and 10B. As understood from the description above, the method 100 may determine the first co-phasal harmonic component and the second co-phasal harmonic component and based on whether the first co-phasal harmonic component increases and/or the second co-phasal harmonic component decreases, a ground fault is detected.

Generally, the first converter 10A and the second converter 10B are used to generate the first predetermined co-phasal harmonic voltage and the second predetermined co-phasal harmonic voltage. A predetermined value or predetermined voltage is in this context a value (or voltage) of a desired form of the co-phasal harmonic voltage, as e.g. set by an operator. The determined co-phasal harmonic components may be compared with the generated predetermined co-phasal harmonic voltages to detect if anything has affected the generated predetermined co-phasal harmonic voltages while propagating. If something affected the generated predetermined co-phasal harmonic voltages, the co-phasal harmonic components will deviate from the generated predetermined co-phasal harmonic voltages, thereby indicating that a ground fault is present. If the generated predetermined first and second co-phasal harmonic voltages are equal, the first co-phasal harmonic component and the second co-phasal harmonic component would also be equal if no ground fault is present. This comparison would during normal operation output a value close to zero and, if a ground fault occurred, the value would increase or decrease. Thereby, a ground fault can be detected.

While the present disclosure is susceptible to various modifications and alternative forms, specific examples are shown and described in relation to the drawings, with a view to clearly explaining the various advantageous aspects of the present disclosure. It should be understood, however, that the detailed description herein and the drawings attached hereto are not intended to limit the disclosure to the particular form disclosed. Rather, the intention is to cover all modifications, equivalents, and alternatives falling within the scope of the following claims, including the possible combination of various elements of these specific examples.

The invention claimed is:

1. A method for detecting a ground fault in an energy storage system comprising at least one string having a plurality of energy storage modules, wherein said at least one string is connected between a first direct current (DC) pole and a second DC pole providing a DC side, and wherein the first DC pole is connected to an AC side through a first converter and the second DC pole is connected to the AC side through a second converter, the method comprising:

receiving at least one phase-to-ground voltage measured at the AC side and at least one pole-to-ground voltage measured at the DC side, determining a first co-phasal harmonic component based on the at least one phase-to-ground voltage measured at the AC side, determining a second co-phasal harmonic component based on the at least one pole-to-ground voltage measured at the DC side, determining a presence of a ground fault if the first co-phasal harmonic component increases and/or the second co-phasal harmonic component decreases, and tripping the energy storage system when the ground fault is detected.

2. The method according to claim 1, wherein the at least one pole-to-ground voltage measured at the DC side comprises voltages measured at the first and second DC poles, and wherein the method further comprises determining a pole unbalance voltage, based on the voltages that were measured at the first and second DC poles, for determining if the ground fault is located at an electrical mid-point of the string or close to a DC pole.

3. The method according to claim 1, wherein a ground fault is determined if the first co-phasal harmonic component increases and/or the second co-phasal harmonic component decreases for a predetermined operating time.

4. The method according to claim 1, further comprising generating a first predetermined co-phasal harmonic voltage with the first and second converters and/or a second predetermined co-phasal harmonic voltage with the first and second converters, and comparing the first predetermined co-phasal harmonic voltage with the determined first co-phasal harmonic component, and/or the second predetermined co-phasal harmonic voltage with the determined second co-phasal harmonic component.

5. The method according to claim 1, further comprising comparing said first co-phasal harmonic component and said second co-phasal harmonic component.

6. The method according to claim 5, further comprising obtaining a control signal based on the first co-phasal harmonic component and the second co-phasal harmonic component, wherein the comparison includes comparing said control signal with a threshold value.

7. The method according to claim 6, wherein the control signal is obtained from a first root mean square (RMS) value of the first co-phasal harmonic component and a second RMS value of the second co-phasal harmonic component.

8. The method according to claim 6, wherein the control signal is obtained by subtracting the second co-phasal harmonic component from the first co-phasal harmonic component.

9. The method according to claim 1, wherein the first co-phasal harmonic component is determined from a residual voltage of the AC side.

10. The method according to claim 1, wherein the second co-phasal harmonic component is determined as a sum of a pole to ground voltage measured at the first DC pole and a pole to ground voltage measured at the second DC pole.

11. The method according to claim 6, wherein the first co-phasal harmonic component is multiplied with a factor 1/k before obtaining the control signal.

12. The method according to claim 11, wherein k is a ratio of a DC side grounding capacitance and an AC side filter capacitance.

13. A control unit for an energy storage system comprising at least one string having a plurality of energy storage modules, wherein said at least one string is connected between a first direct current (DC) pole and a second DC pole providing a DC side, and wherein the first DC pole is connected to an AC side through a first converter and the second DC pole is connected to the AC side through a second converter, the control unit being configured to:

receive at least one phase-to-ground voltage measured at the AC side and at least one pole-to-ground voltage measured at the DC side, determine a first co-phasal harmonic component based on the at least one phase-to-ground voltage measured at the AC side, determine a second co-phasal harmonic component based on the at least one pole-to-ground voltage measured at the DC side, determine a presence of a ground fault if the first co-phasal harmonic component increases and the second co-phasal harmonic component decreases, and trip the energy storage system if a ground fault is detected.

14. An energy storage system comprising:

at least one string having a plurality of energy storage modules, wherein said at least one string is connected between a first direct current, DC, pole and a second DC pole providing a DC side, and wherein the first DC pole is connected to an AC side through a first converter and the second DC pole is connected to the AC side through a second converter, and a control unit according to claim 13.

15. The energy storage system according to claim 14, further comprising a first capacitor grounding for the first DC pole and a second capacitor grounding for the second DC pole, and a resistor-capacitor (RC) filter for each phase at the AC side.

16. The energy storage system according to claim 14, further comprising a voltage measurement device for each phase at the converter AC side to measure a respective phase to ground voltage and for each of the first DC pole and the second DC pole to measure a respective pole to ground voltage.

17. The energy storage system according to claim 14, wherein the AC side and the DC side are ungrounded or high impedance grounded.

* * * * *